United States Patent
Beck et al.

(10) Patent No.: US 9,813,053 B2
(45) Date of Patent: Nov. 7, 2017

(54) GATE CAPACITANCE CONTROL IN A LOAD SWITCH

(71) Applicant: Texas Instruments Incorporated, Dallas, TX (US)

(72) Inventors: Sungho Beck, Plano, TX (US); Johnny Klarenbeek, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/198,618

(22) Filed: Jun. 30, 2016

(65) Prior Publication Data

US 2017/0244403 A1   Aug. 24, 2017

Related U.S. Application Data

(60) Provisional application No. 62/298,213, filed on Feb. 22, 2016.

(51) Int. Cl.
| | | |
|---|---|---|
| *H03B 1/00* | (2006.01) | |
| *H03K 17/081* | (2006.01) | |
| *H02M 3/07* | (2006.01) | |

(52) U.S. Cl.
CPC ........ *H03K 17/08104* (2013.01); *H02M 3/07* (2013.01)

(58) Field of Classification Search
None
See application file for complete search history.

(56) References Cited

U.S. PATENT DOCUMENTS

| | | | |
|---|---|---|---|
| 7,054,172 B2 | 5/2006 | Culler | |
| 2011/0163796 A1* | 7/2011 | Floyd | H03K 17/166 327/536 |
| 2014/0002145 A1* | 1/2014 | Mauder | H03K 17/06 327/109 |

FOREIGN PATENT DOCUMENTS

| | | |
|---|---|---|
| WO | 1999025062 | 5/1999 |
| WO | 2004040767 A2 | 5/2004 |
| WO | 2015109357 A1 | 7/2015 |

OTHER PUBLICATIONS

Search Report from PCT/2017018990, dated May 25, 2017.

* cited by examiner

*Primary Examiner* — Cassandra Cox
(74) *Attorney, Agent, or Firm* — Lawrence J. Bassuk; Charles A. Brill; Frank D. Cimino

(57) ABSTRACT

A switch for controlling a power supply and a method of operating the switch are disclosed. The switch includes a first transistor having a drain and a source connected between $V_{IN}$ and $V_{OUT}$ and a gate connected to be driven to a first voltage that is greater than $V_{IN}$, an external capacitor operable, when connected to the gate of the first transistor, to control a rise time of $V_{OUT}$, and a circuit coupled to the gate of the first transistor and to the external capacitor, the circuit connected to couple the external capacitor to the gate of the first transistor responsive to an enable signal turning on and to uncouple the external capacitor from the gate of the first transistor responsive to the voltage on the gate reaching the first voltage.

11 Claims, 9 Drawing Sheets

GATE CAPACITANCE CONTROL IN A LOAD SWITCH

CLAIM OF PRIORITY AND RELATED PATENT APPLICATIONS

This nonprovisional application claims priority based upon the following prior United States provisional patent application(s): (i) "METHOD OF GATE CAPACITANCE CONTROL IN A SWITCH," Application No. 62/298,213, filed Feb. 22, 2016, in the name(s) of Sugnho [sic] Beck and Johnny Klarenbeek; which is hereby incorporated by reference in its entirety.

FIELD OF THE DISCLOSURE

Disclosed embodiments relate generally to the field of load switches. More particularly, and not by way of any limitation, the present disclosure is directed to the control of gate capacitance in a load switch.

BACKGROUND

Some load switches utilize an external capacitor that is directly connected to the gate of a power switch to control the rise time and in-rush current to the gate. At the time the switch is turned off, the input power supply is used to power a circuit that discharges the external capacitor in preparation for a next on-period. When the input power supply drops while the switch is on, there is no power to discharge the external capacitor. This condition causes two problems: 1) gate-oxide reliability concerns in the transistor that controls the output voltage because of the high gate/source voltage, $V_{GS}$, when the external capacitor is not discharged and 2) when the input supply ramps up again, there can be an uncontrolled output or spike in the output voltage, potentially causing downstream issues.

SUMMARY

Disclosed embodiments provide circuitry to disconnect the external capacitor from the gate of the transistor controlling $V_{OUT}$ once the transistor is fully on. The capacitor is then discharged while the switch is still turned on.

In one aspect, an embodiment of a switch for controlling a power supply is disclosed. The switch includes a first transistor having a drain and a source connected between VIN and VOUT and a gate connected to be driven to a first voltage that is greater than VIN, an external capacitor operable, when connected to the gate of the first transistor, to control a rise time of VOUT; and a circuit coupled to the gate of the first transistor and to the external capacitor, the circuit connected to couple the external capacitor to the gate of the first transistor responsive to an enable signal turning on and to uncouple the external capacitor from the gate of the first transistor responsive to the voltage on the gate reaching the first voltage.

In another aspect, an embodiment of a method of operating a load switch is disclosed. The method includes coupling an external gate capacitor to a gate of a transistor that selectively connects $V_{IN}$ and $V_{OUT}$ responsive to an ON pin going high; and uncoupling the external gate capacitor from the gate of the transistor responsive to the gate reaching a given voltage that is greater than $V_{IN}$.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 8 illustrate issues that can arise when input power drops while the switch is turned on.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more example embodiments set forth herein, generally speaking, an element, component or module may be configured to perform a function if the element is capable of performing or otherwise structurally arranged to perform that function.

Figure 7A:
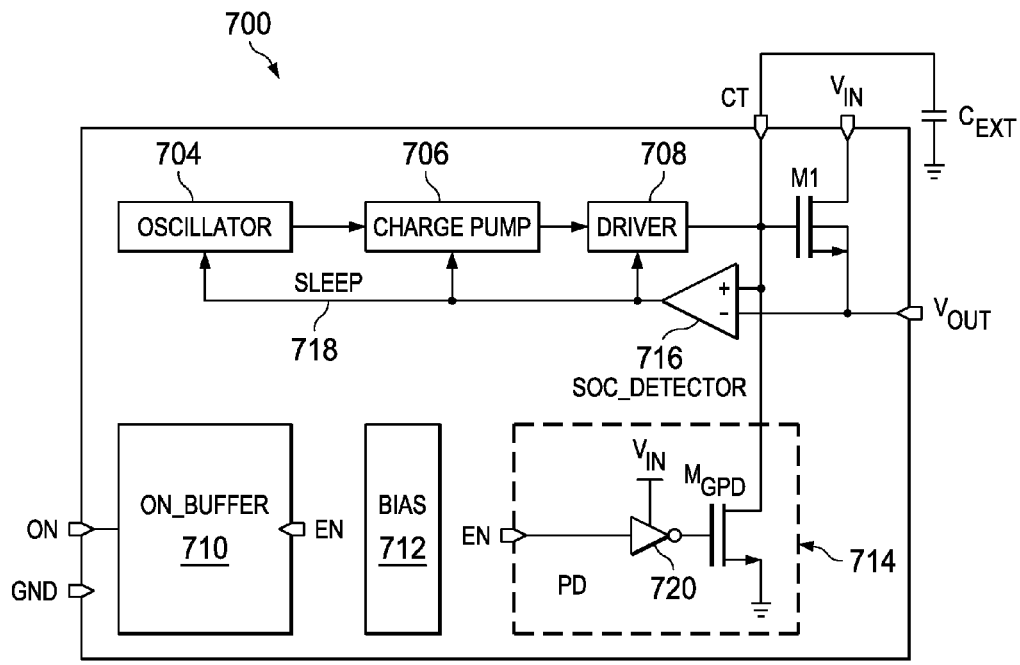
FIG. 7A depicts a schematic of a load switch according to the known art.

Load switches are integrated circuit relays used to turn power rails on and off. Turning first to FIG. 7A, a schematic block diagram of an example Load Switch 700 as known in the art is shown. NMOS Transistor M1 is the main component of Load Switch 700 and is connected between Input Signal $V_{IN}$ and Output Signal $V_{OUT}$. The characteristics of M1 determine the maximum input voltage and load current that Load Switch 700 can handle, as well as the on-resistance of the load switch, which is used in calculating the power dissipated by Load Switch 700.

Driver 708 charges the gate of M1 at a controlled rate that is determined by the capacitance of External Capacitor $C_{EXT}$. This controlled rate defines the rise time of the device. In order to have a low resistance between $V_{IN}$ and $V_{OUT}$ when the switch is on, it is desirable to drive the gate of M1 to a given voltage, $V_{GV}$, above $V_{IN}$. ($V_{IN}+V_{GV}$) is determined to be a voltage that can provide the lowest resistance on M1 without causing damage to M1. In one prior art load switch, $V_{GV}$ is determined to be equal to 7 volts. Charge Pump 706 is used to generate this higher voltage from $V_{IN}$ and to provide this higher voltage to Driver 708

Once the gate of M1 has been charged to $V_{IN}+V_{GV}$, it is desirable to put Oscillator 704 and Charge Pump 706 into a sleep mode to provide lower-power operation. State of Charge Detector (SOC_Detector) 716 compares gate voltage $V_{GATE}$ to $V_{OUT}+V_{GV}$ and provides Sleep Signal 718 when $V_{GATE}$ is greater. In one example embodiment, SOC_Detector 716 provides the Sleep Signal when $V_{GATE}>V_{IN}+7V$. On-Buffer 710, which provides control logic, is driven by an external logic signal ON that controls the turn-on and turn-off of the pass FET and other blocks. Bias Circuit 712 provides a bias current where necessary.

Discharge Circuit 714 is connected between the gate of FET M1 and a ground voltage in order to discharge both the gate of M1 and Capacitor $C_{EXT}$. Discharge Circuit 714 receives an Enable Signal (EN) when Signal ON indicates that the switch is to be on. Inverter 720 will invert EN to drive NMOS Transistor $M_{GPD}$ such that when external logic signal ON is turned off, Transistor $M_{GPD}$ is turned on and discharges External Capacitor $C_{EXT}$.

Figure 7B:
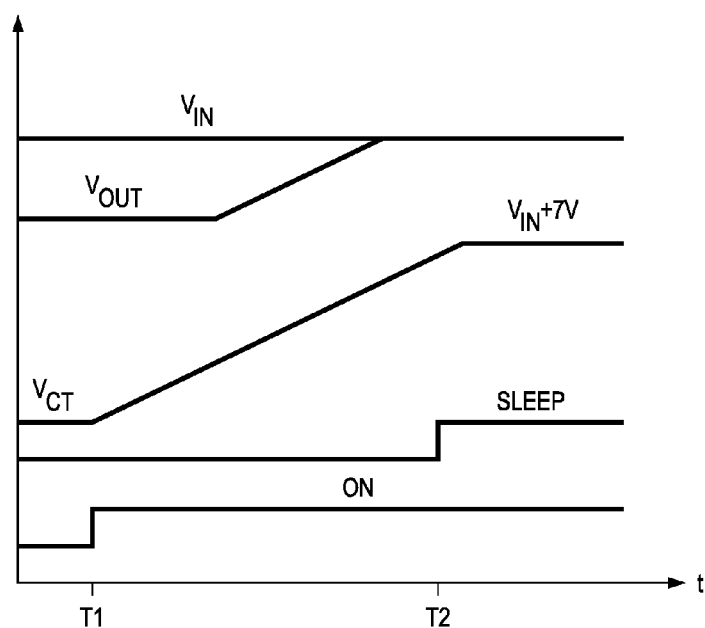
FIG. 7B illustrates various signals associated with the load switch of FIG. 7A.

FIG. 7B discloses a simulation of the signals that are present on Load Switch 700 during normal operation. In an initial state, input voltage $V_{IN}$ is high, while all other signals are low. At time T1, the ON signal goes high and Driver 708 begins to charge the gate of NMOS Transistor M1, causing $V_{GATE}$, which is also $V_{CT}$, to begin to rise. Initially, the gate voltage rises, but output voltage $V_{OUT}$ remains low until the threshold voltage of NMOS Transistor M1 has been reached, when $V_{OUT}$ begins to rise at a controlled rate until it reaches $V_{IN}$. In the example shown, $V_{CT}$ will continue to rise until it reaches $V_{IN}+V_{GV}$ to provide a low on-resistance across M1. At time T2, which is after $V_{OUT}$ has stabilized and $V_{CT}$ has reached $V_{IN}+V_{GV}$, Sleep Signal 718 is triggered, Oscillator 704 and Charge Pump 706 go to sleep and gate voltage $V_{CT}$ stops rising.

Figure 8:
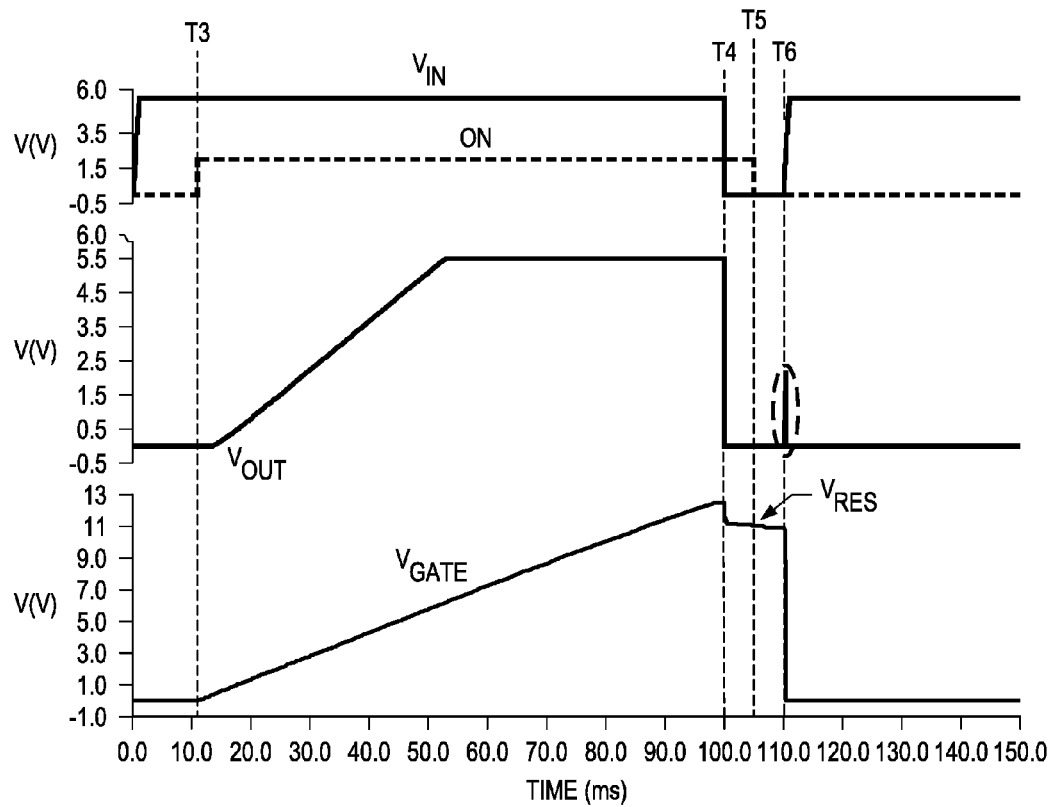

FIG. 8 discloses a simulation of the signals on Load Switch 700 when $V_{IN}$ drops while the ON signal is still high, causing undesired consequences. As seen in this figure, $V_{ON}$ turns on at time T3. Once that happens, $V_{CT}$ starts to rise and as soon as the threshold voltage on M1 has been reached, $V_{OUT}$ also starts to rise. After $V_{OUT}$ has reached $V_{IN}$, $V_{IN}$ drops at time T4. $V_{OUT}$ drops to zero, but $V_{CT}$ cannot be fully discharged because there is no power supply to operate Discharge Circuit 714, so $V_{CT}$ maintains a residual voltage, $V_{RES}$. The excessive $V_{GS}$, which is equal to $V_{RES}$, causes reliability concerns on the main switch while $V_{IN}=0V$. At time T5, the ON switch turns off and at time T6, $V_{IN}$ is restored. Once the power is restored, Discharge Circuit 714 is able to discharge $V_{CT}$, but before the gate voltage can be discharged, $V_{OUT}$ starts to turn on, causing the spike, which is circled, in $V_{OUT}$.

Figure 9A:
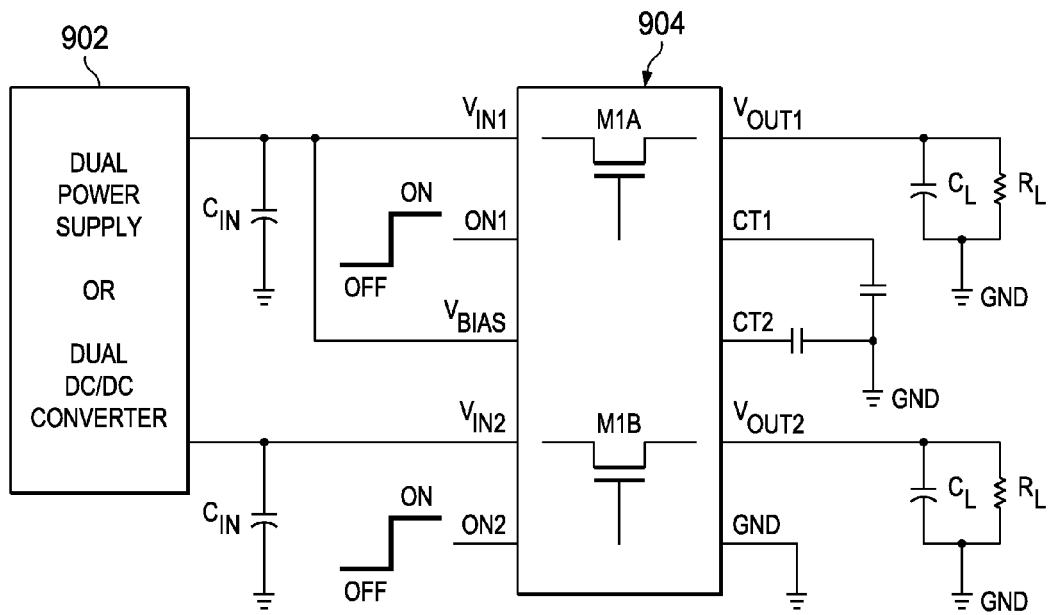
FIGS. 9A-C depict schematic diagrams of prior art solutions to the problems associated with a drop in input power.

FIG. 9A illustrates one prior art solution to these issues, which uses dual power supply 902 to provide another power source, which in this figure is labeled $V_{BIAS}$, to Load Switch 904, which contains dual load switches having transistors M1A and M1B. $V_{BIAS}$ is used to power the control circuitry. However, this solution increases the pin count, as well as the area required for the implementation, both of which adversely affect the cost and convenience of the solution.

Figure 9B:
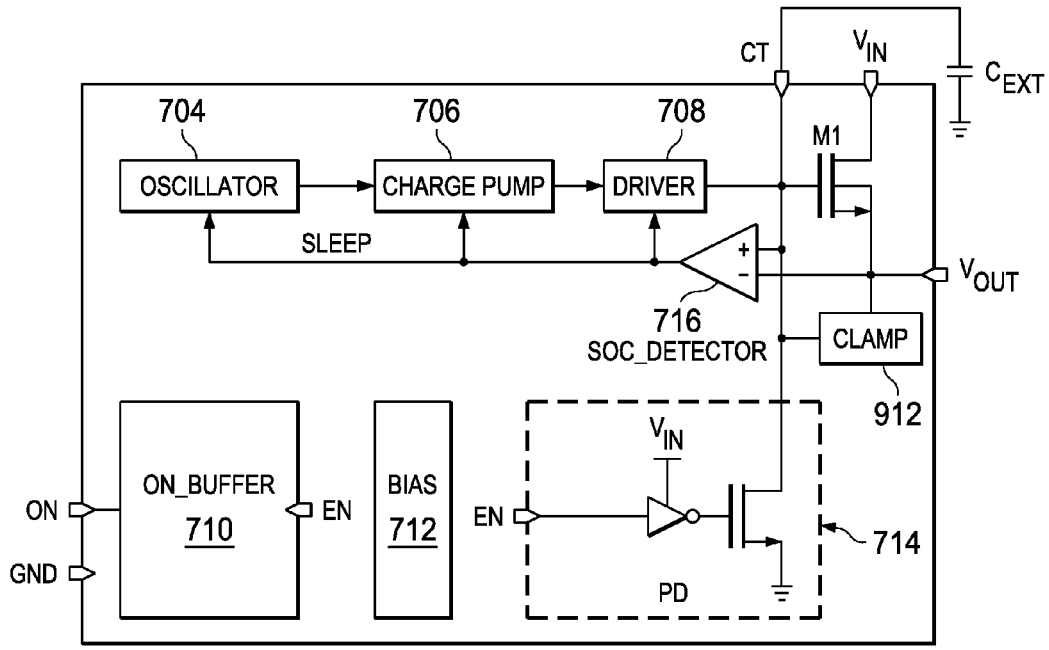

FIG. 9B illustrates a second prior art solution, which modifies the load switch to prevent damage to the gate. FIG. 9B is generally the same as FIG. 7A, except that Clamp Circuit 912 is added between the gate and source of Transistor M1 to ensure that $V_{GS}$ of M1 does not rise above a selected value. In an example embodiment in which $V_{GV}=7$ volts, Clamp Circuit 912 will discharge when $V_{GS}$ becomes greater than 7.1 V, i.e., greater than $V_{GV}$ and will discharge $V_{GS}$ to 7.1 V, but will not completely discharge the capacitor. Thus, while the clamp circuit can prevent damage from excessively high $V_{GS}$, Clamp Circuit 912 cannot prevent a bump on $V_{OUT}$ and will not zero $V_{GS}$. Another concern is that adding the clamp circuit may require additional masks during the processing of the circuit. Additionally, the clamp can be somewhat active at certain combinations of IC process, voltage and temperature, causing the quiescent current (the current drawn when the device is enabled and there is no load on the output) and the on-resistance ($R_{ON}$) to increase under these conditions, which degrades performance of the switching device. Load switches typically have some quiescent current in order to provide a low $R_{ON}$ across input voltages, although it should be kept as low as possible. The maximum voltage at the CT pin, of course, is equal to $V_{IN\_MAX}+V_{CLAMP}$.

Figure 9C:
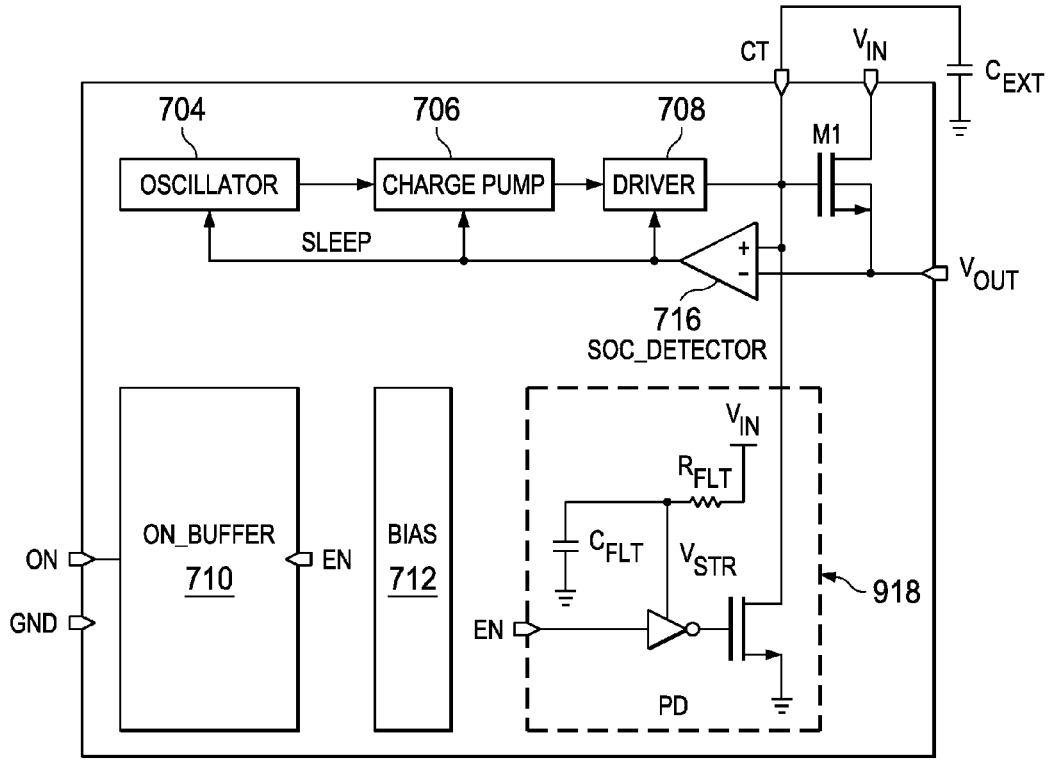

FIG. 9C illustrates a further prior art modification to the load switch to prevent damage to the gate. To turn off the switch without $V_{IN}$, a low-pass filter is added to Discharge Circuit 918. The low-pass filter, which includes Capacitor $C_{FLT}$ and Resistor $R_{FLT}$ holds voltage $V_{STR}$ until Discharge Circuit 918 is activated (i.e., when the ON switch is turned off), at which point the stored voltage is used to power Discharge Circuit 918 long enough to discharge $V_{CT}$. This method works well when external capacitor $C_{EXT}$ is low capacitance, but cannot be used for a large external capacitance at the CT pin, as this would require a much larger area for Capacitor $C_{FLT}$, which is undesirable to use for this circuit due to the increased costs.

Figure 1:
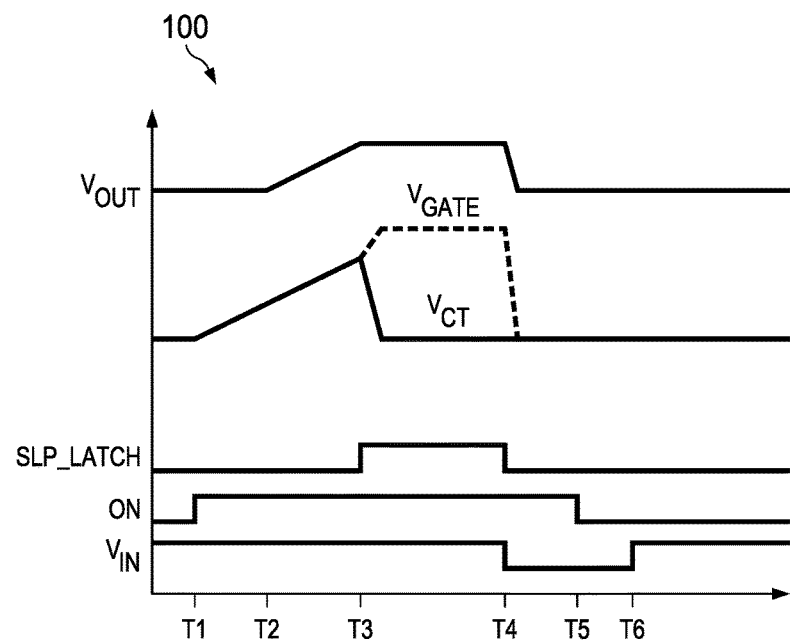
FIG. 1 depicts a desired response of the $V_{GATE}$, $V_{CT}$, and $V_{OUT}$ signals that are associated with the load switch according to an embodiment of the disclosure.

Looking now at FIG. 1, which illustrates many of the signals associated with a desired response of a load switch, Applicants have recognized that once $V_{OUT}$ reaches $V_{IN}$, the external capacitor has fulfilled its function and is no longer needed; thus the capacitor can be discharged while the switch is still on. As seen in graph 100, $V_{GATE}$ and $V_{CT}$ begin rising at time T1, when the ON switch goes high and at T2, $V_{OUT}$ also starts rising. $V_{GATE}$ and $V_{CT}$ continue to rise together until $V_{OUT}$ reaches $V_{IN}$ at time T3, at which point these two voltages can be treated differently. As shown, the two voltages split, with $V_{GATE}$ rising rapidly until it reaches the designed voltage for a low $R_{ON}$ of M1, while $V_{CT}$, which is associated with the external capacitor, is discharged. When $V_{IN}$ is lost at time T4, $V_{GATE}$ is also discharged to a zero voltage. Once both the external capacitor and the gate of M1 are discharged, the restoration of $V_{IN}$ does not cause the previously seen spike on $V_{OUT}$ because the there is no excess charge on the gate. The timing of allowing $V_{GATE}$ and $V_{CT}$ to separate can be based on SLP_LATCH, which is the latched version of the SLEEP signal noted in FIG. 7A. In this scenario, when the ON switch goes low at T5, followed by $V_{IN}$ being restored at T6, no spike appears on $V_{OUT}$.

Figure 2:
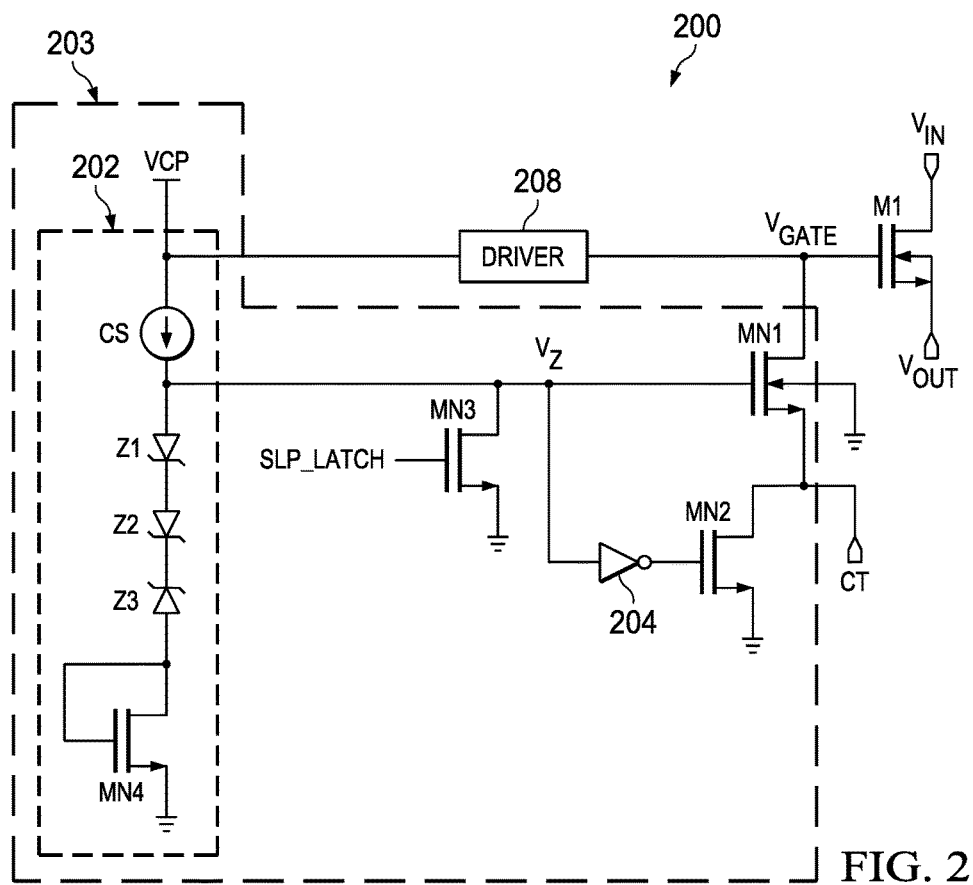
FIG. 2 depicts a load switch that can accomplish the desired output of FIG. 1 according to an embodiment of the disclosure.

Referring now to FIG. 2, a simplified circuit diagram of a load switch is shown according to an embodiment of the disclosure. In order to emphasize the disclosed circuit, only Driver 208, Transistor M1 and the CT pin to which the external capacitor is coupled are shown, although it will be understood that the other elements of the load switch as seen in FIG. 7A are simply not illustrated in this figure. In load switch 200, Pin CT and External Capacitor $C_{EXT}$ are not directly connected to the gate of Transistor M1; instead these elements are separated by Transistor MN1 of sub-circuit 203, with the drain of MN1 connected to the gate of M1 and the source of MN1 connected to Pin CT. The gate of Transistor MN1 is controlled by voltage $V_Z$, which is provided by Circuit 202. Circuit 202 receives voltage $V_{CP}$ from the charge pump and in this embodiment contains a current source CS, Zener diodes Z1, Z2, Z3, and NMOS Transistor MN4 connected in series. NMOS Transistor MN2 has a gate coupled to voltage $V_Z$ through Inverter 204, a drain coupled to Pin CT and a source coupled to the lower rail. NMOS Transistor MN3 has a drain connected to voltage $V_Z$, a source connected to the lower rail and a gate controlled by SLP_LATCH.

Figure 2A:
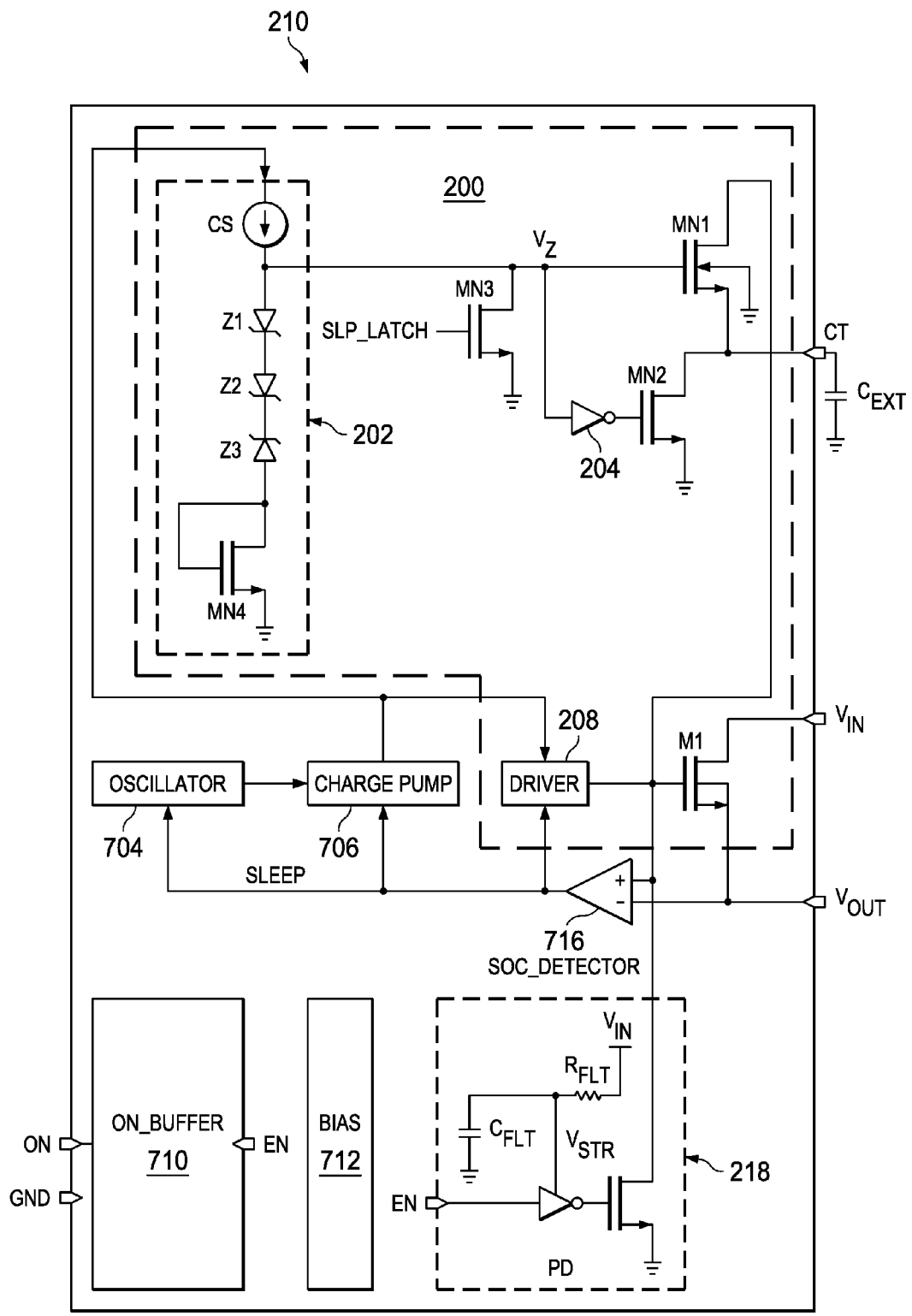
FIG. 2A depicts a chip that incorporates the disclosed circuit of FIG. 2.

When SLP_LATCH is low, Transistor MN3 is off, allowing Voltage $V_Z$ to remain high, which turns on Transistor MN1. The voltage on Pin CT is the same as $V_{GATE}$ because Transistor MN1 is on. If SLP_LATCH triggers to high, Transistor MN3 turns on, pulling $V_Z$ towards ground and turning off Transistor MN1. When MN1 is off, Pin CT is uncoupled from the gate of M1. At the same time, MN2, which has been off while MN1 was on, will now turn on and discharge External Capacitor $C_{EXT}$. When the SLEEP signal goes low again, Pin CT will once again be connected to the gate of Transistor M1. It will be understood by one skilled in the art that the transistors in the disclosed embodiment are illustrated as NMOS transistors, but the circuit can also be realized in other technologies, e.g., bipolar junction transistors or PMOS transistors. Applicants note that once the charge of large external capacitor $C_{EXT}$ is not an issue, discharging the residual voltage from the internal gate, which has smaller capacitance, can be handled by an internal discharging block powered by a storage capacitor, such as the circuit seen in FIG. 9C. FIG. 2A shows chip 210, which incorporates disclosed load switch 200 and internal discharging block 218 into the circuitry of earlier chips.

For the circuit to operate as intended, an appropriate value for voltage $V_Z$ should be selected. Applicant notes that $V_Z$ should be greater than the combination of the maximum ($V_{IN}+V_{TH}$ of M1+$V_{TH}$ of MN1) in order to ensure that MN1 is turned on at the maximum $V_{IN}$. Beyond this minimum voltage, it is desirable to keep the value of $V_Z$ low, as a higher voltage on the circuit generally requires wider spacing between components, leading to an increase in silicon area. Applicants also note that $V_{CT}$ is limited to the lesser of ($V_{IN}+V_{GV}$) and ($V_Z-V_{TH}$ of MN1). The latter of these limits is because of a clamping operation of MN1 above that value, which occurs because ($V_Z-V_{TH}$ of MN1) is smaller than ($V_{IN}+V_{GV}$) and which can be useful in some embodiments, as will be explained below. $V_{IN}+V_{GV}$ is the voltage at which SLP_LATCH is triggered, separating the CT pin from the gate of M1. As the limit for $V_{CT}$ in this embodiment can be less than the voltage necessary in prior art circuits, this allows the use of a low-voltage external capacitor and low-voltage electrostatic discharge (ESD) cells with this circuit.

Figure 3:
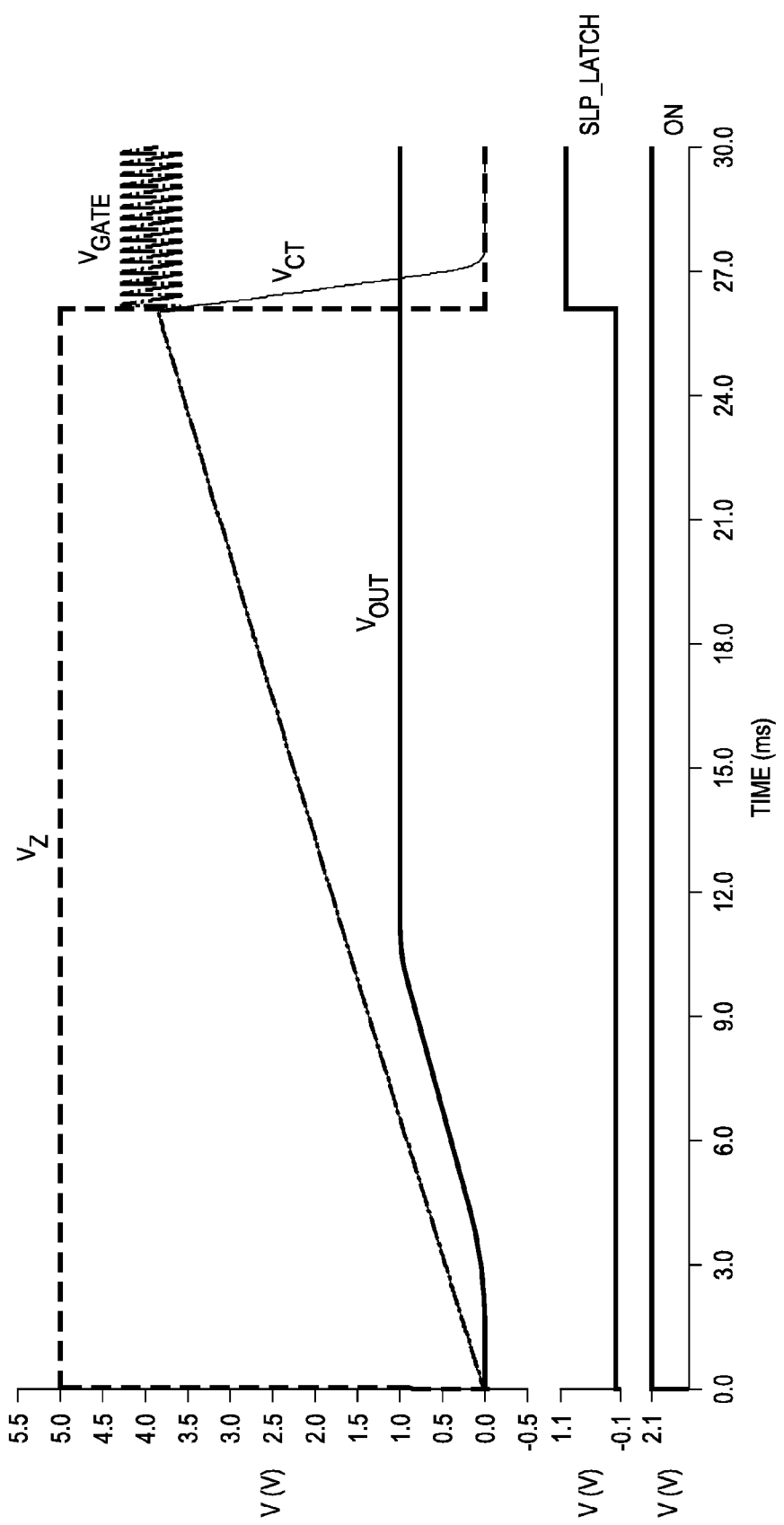
FIG. 3 illustrates simulated signals for the embodiment of FIG. 1 at an example input voltage of 1V.
Figure 4A:
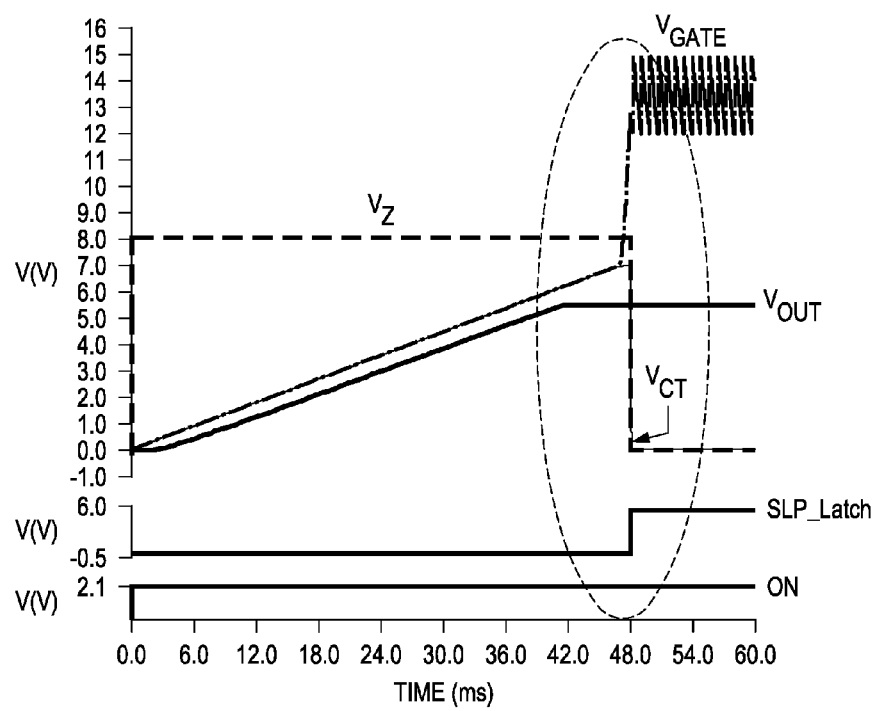
FIG. 4A-B illustrate simulated signals for the embodiment of FIG. 1 at an example input voltage of 5.5V and at two different magnifications.
Figure 4B:
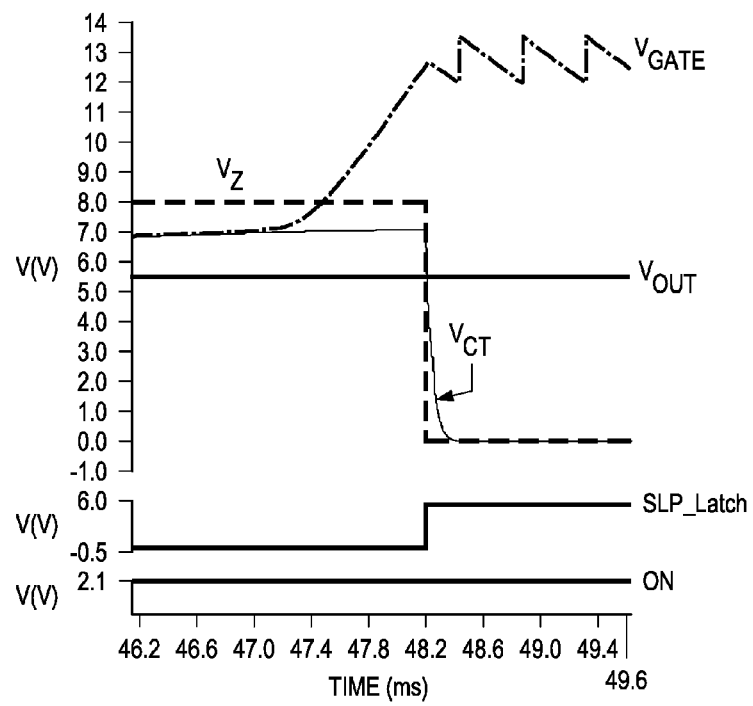

Two examples of different simulated embodiments of the disclosed circuit are shown in FIG. 3 and FIGS. 4A-B. FIG. 3 depicts a simulation of the signals associated with load switch 200 of FIG. 2 with values of $V_{IN}=1V$, a capacitance of 10 nF on the external capacitor, SLEEP is triggered at $V_{IN}+2.75V$, and $V_Z=5V$. As seen at the bottom of Graph 300, the ON switch turns on at time 0.0, as does $V_Z$, and both $V_{GATE}$ and $V_{CT}$ rise together. At around 3 ms, $V_{OUT}$ also starts to rise until $V_{OUT}$ reaches the value of $V_{IN}$ and levels out. $V_{GATE}$ and $V_{CT}$ continue to rise until about 26 ms, when SLP_LATCH goes high as $V_{GATE}$ becomes greater than $V_{IN}+2.75V$. $V_{CT}$ is disconnected from $V_{GATE}$ and is discharged within a few milliseconds.

FIG. 4A depicts a simulation in which $V_{IN}$ is 5.5V, $V_Z$ is 8V, and the SLEEP signal is triggered at $V_{IN}+2.0$ V; the capacitance remains 10 nF. The signals respond as in the previous example until $V_{CT}$ reaches 7V, at which point Transistor MN1 is clamped ($V_{TH}$ of MN1 being equal to 1V) and $V_{CT}$ stops rising. The signals at this point in time, which are encircled in FIG. 4A, are enlarged in FIG. 4B to make the signals clearer. As shown in this figure, as $V_{CT}$ stops rising, the external capacitor is no longer holding down the rise time of $V_{GATE}$, which is then free to rise very quickly. Since $V_{OUT}$ has already stabilized at 5.5 V, this is not a problem. When SLP_LATCH goes high at time 48.2 ms, $V_{CT}$ is discharged in a few tenths of a millisecond. By setting $V_Z$ such that ($V_Z-V_{TH}$ of MN1)<($V_{IN}+V_{SOC\_DETECT}$), $V_{CT}$ can be lower than in prior art versions of this load switch, allowing the choice of a low-voltage external capacitor.

Figure 5:
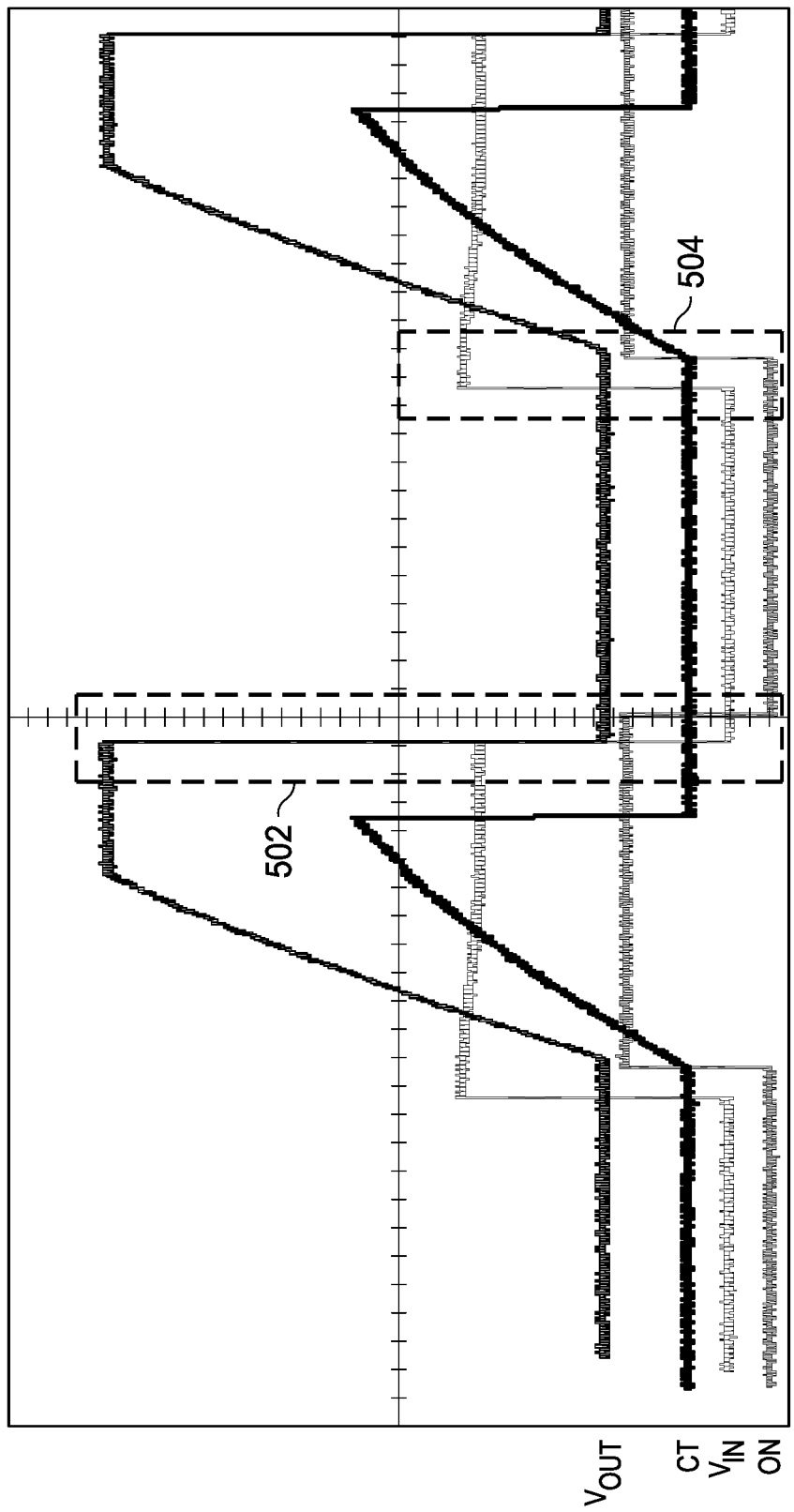
FIG. 5 depicts the measured signals for an embodiment of the disclosed switch.

FIG. 5 shows the signals ON, $V_{IN}$, $V_{CT}$ and $V_{OUT}$ during testing, which in this embodiment was at $V_{IN}$ equal to 5.0 V. All four signals are shown overlying each other so that their relationships are easy to see. The loss of $V_{IN}$ while ON is still high is seen in Region 502. When $V_{IN}$ is regained at Region 504, there is no bump on $V_{OUT}$ and $V_{CT}$ has been discharged.

Figure 6:
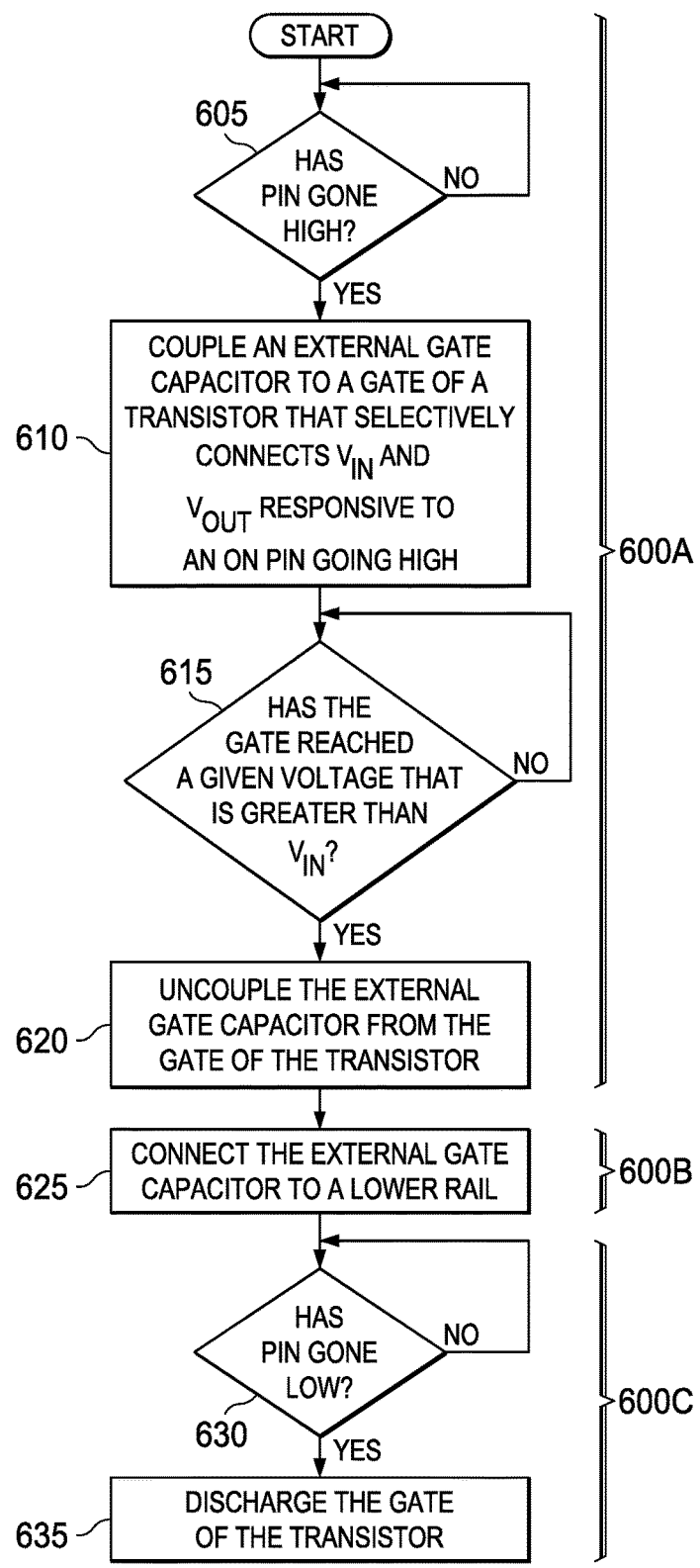
FIG. 6 depicts a flowchart for a method of operating a load switch according to an embodiment of the disclosure.

FIG. 6 depicts a flowchart of a method of operating a load switch. Method 600 begins in 600A with determining (605) whether the ON pin has gone high. If the pin is not high, the load switch is in a waiting mode, but if the ON pin has gone high, the method couples (610) an external capacitor to the gate of a transistor that selectively connects $V_{IN}$ and $V_{OUT}$. As the gate charges, the method determines (615) whether the gate has reached a given, i.e., predetermined, voltage that is greater than $V_{IN}$. If the gate has not reached the given voltage, the circuit continues charging the gate; otherwise the method uncouples (620) the external gate capacitor from the gate of the transistor. The method continues in 600B with connecting (625) the external gate capacitor to a lower rail. The load switch will continue operating normally at 600 C, while the method determines (630) whether the ON pin has gone low. Once the pin goes low, the method discharges (635) the gate of the transistor, e.g., by using a stored capacitor, as was seen in FIG. 2A.

Applicant has disclosed a load switch and a method of operating the same that can provide one or more of the following advantages:
  Prevent damage to the gate oxide of the switching transistor when $V_{IN}$ is lost while the switch is turned on;
  Prevent an uncontrolled bump on $V_{OUT}$ when $V_{IN}$ is restored;
  No additional pins are needed;
  Low voltage on the CT pin;

Reduce the board area required because of the low voltage on the CT pin; and

No limit on capacitance of the external capacitor.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A switch for controlling a power supply comprising:
   a first transistor having a drain and a source connected between VIN and VOUT and a gate connected to be driven to a first voltage that is greater than VIN;
   an external capacitor operable, when connected to the gate of the first transistor, to control a rise time of VOUT; and
   a circuit coupled to the gate of the first transistor and to the external capacitor, the circuit connected to couple the external capacitor to the gate of the first transistor responsive to an enable signal turning on and to uncouple the external capacitor from the gate of the first transistor responsive to the voltage on the gate reaching the first voltage.

2. The switch as recited in claim 1 wherein the circuit comprises:
   a second transistor having a drain and a source respectively coupled to the gate of the first transistor and to the external capacitor;
   a power source coupled to provide a second voltage to the gate of the second transistor; and
   a third transistor having a drain coupled to the gate of the second transistor, the third transistor being coupled to connect the second voltage to a lower rail responsive to a sleep signal.

3. The switch as recited in claim 2 wherein a gate of the third transistor is connected to be controlled by a latched version of the sleep signal.

4. The switch as recited in claim 3 further comprising a fourth transistor having a drain and a source respectively connected to the external capacitor and to a lower rail, the fourth transistor being connected to be driven by an inverse of the second voltage.

5. The switch as recited in claim 4 wherein the second voltage is greater than a combination of a highest VIN, a threshold voltage of the first transistor and a threshold voltage of the second transistor.

6. The switch as recited in claim 5 wherein a maximum voltage of the external capacitor is the lower of the value of the second voltage minus a threshold voltage of the first transistor and the value of a voltage at which the sleep signal is turned on.

7. The switch as recited in claim 1 further comprising a driver connected to the gate of the first transistor and a charge pump connected to provide the first voltage.

8. The switch as recited in claim 1 wherein the first voltage provides low resistance across the first transistor.

9. A method of operating a load switch, the method comprising:
   coupling an external gate capacitor to a gate of a transistor that selectively connects VIN and VOUT responsive to an ON pin going high; and
   uncoupling the external gate capacitor from the gate of the transistor responsive to the gate reaching a given voltage that is greater than VIN.

10. The method as recited in claim 9, further comprising connecting the external gate capacitor to a lower rail.

11. The method as recited in claim 9, further comprising discharging the gate of the transistor responsive to the ON pin going low.

* * * * *